United States Patent
Francis et al.

(10) Patent No.: US 12,425,036 B2
(45) Date of Patent: Sep. 23, 2025

(54) MITIGATING GAIN MISMATCH INTERFERENCE IN ANALOG-TO-DIGITAL CONVERTER CIRCUITRY

(71) Applicant: XILINX, INC., San Jose, CA (US)

(72) Inventors: Roswald Francis, Kildare (IE); Bob W. Verbruggen, Dublin (IE); Pedro Faria, Dublin (IE)

(73) Assignee: XILINX, INC., San Jose, CA (US)

( * ) Notice: Subject to any disclaimer, the term of this patent is extended or adjusted under 35 U.S.C. 154(b) by 196 days.

(21) Appl. No.: 18/372,596

(22) Filed: Sep. 25, 2023

(65) Prior Publication Data

US 2025/0105851 A1   Mar. 27, 2025

(51) Int. Cl.
*H03M 1/06* (2006.01)

(52) U.S. Cl.
CPC .................................. *H03M 1/0602* (2013.01)

(58) Field of Classification Search
CPC ..... H03M 1/06; H03M 1/0602; H03M 1/0617
See application file for complete search history.

(56) References Cited

U.S. PATENT DOCUMENTS

| | | | | |
|---|---|---|---|---|
| 6,229,469 B1* | 5/2001 | Gaudet | .................. | H03M 3/042 341/143 |
| 6,377,196 B1* | 4/2002 | Kolsrud | ................ | H03M 1/187 341/131 |
| 6,581,181 B1* | 6/2003 | Sonu | ................ | G11B 20/10009 714/795 |
| 6,956,505 B2* | 10/2005 | Taniguchi | ........... | H03M 1/1038 341/11 |
| 7,391,452 B2* | 6/2008 | Itani | ...................... | H03M 1/187 348/222.1 |
| 7,545,302 B1* | 6/2009 | Silva | ..................... | H03M 3/476 341/143 |
| 7,545,303 B1* | 6/2009 | Silva | ..................... | H03M 3/476 341/143 |
| 7,928,878 B1* | 4/2011 | Coban | ................... | H03M 3/344 341/143 |
| 8,711,026 B1* | 4/2014 | Kappes | ................. | H03M 1/007 341/155 |
| 8,749,419 B2* | 6/2014 | Moldsvor | ........... | H03M 1/0656 341/122 |

(Continued)

*Primary Examiner* — Lam T Mai
(74) *Attorney, Agent, or Firm* — Patterson + Sheridan, LLP (57) ABSTRACT

An analog-to-digital converter (ADC) circuitry includes channels that are interleaved with each other to generate output digital signals from input analog signals. A first channel includes sub-ADC circuitry, amplitude detection circuitry, and correction circuitry. Random chopping is applied by chopping circuitry at the input of the sub-ADC circuitry while sampling. The sub-ADC circuitry outputs digital data corresponding to the chopping states. Gain mismatch within the chopping circuitry is mitigated by determining correction values via the amplitude detection circuitry and the correction circuitry and applying the correction values to the output of the sub-ADC circuitry. The amplitude detection circuitry determines an amplitude difference between data signals. The correction circuitry is coupled to the output of the amplitude detection circuitry. The correction circuitry generates the correction values based on the amplitude difference, and outputs the correction values to adjust the data signals.

20 Claims, 8 Drawing Sheets

(56) References Cited

U.S. PATENT DOCUMENTS

| | | | | |
|---|---|---|---|---|
| 8,766,835 B2* | 7/2014 | Hojabri | | H03M 3/458 |
| | | | | 341/143 |
| 9,172,388 B1* | 10/2015 | Stein | | H03M 1/121 |
| 9,401,726 B2* | 7/2016 | Ragab | | H03M 1/121 |
| 9,407,276 B1* | 8/2016 | Coban | | H03M 1/1009 |
| 10,320,405 B2* | 6/2019 | Reddy Naru | | H03M 1/1205 |
| 11,095,299 B1* | 8/2021 | Le | | H03M 1/126 |
| 11,133,813 B2* | 9/2021 | Lai | | H03M 1/804 |
| 12,015,419 B2* | 6/2024 | Francis | | H03M 1/124 |
| 2004/0179118 A1* | 9/2004 | Itani | | H03M 1/187 |
| | | | | 348/E5.041 |
| 2010/0060496 A1* | 3/2010 | Madisetti | | H03M 1/0624 |
| | | | | 341/118 |
| 2010/0164763 A1* | 7/2010 | Kidambi | | H03M 1/1028 |
| | | | | 341/118 |
| 2011/0063149 A1* | 3/2011 | Kidambi | | H03M 1/06 |
| | | | | 341/118 |
| 2012/0075129 A1* | 3/2012 | Kidambi | | H03M 1/1052 |
| | | | | 341/118 |
| 2012/0146819 A1* | 6/2012 | Silva | | G01R 19/02 |
| | | | | 341/110 |
| 2012/0146824 A1* | 6/2012 | Silva | | G06J 1/00 |
| | | | | 341/143 |
| 2015/0288380 A1* | 10/2015 | Zhao | | H03M 3/37 |
| | | | | 341/120 |
| 2016/0149582 A1* | 5/2016 | Ragab | | H03M 1/121 |
| | | | | 341/120 |
| 2019/0007071 A1* | 1/2019 | Nagarajan | | H03M 1/1014 |
| 2021/0194491 A1* | 6/2021 | Sjöland | | H03M 1/1023 |
| 2021/0194495 A1* | 6/2021 | Ballini | | H03M 1/46 |
| 2023/0132872 A1* | 5/2023 | Melanson | | H03M 1/822 |
| | | | | 341/110 |
| 2023/0179217 A1* | 6/2023 | Wilson | | G01R 31/3828 |
| | | | | 341/120 |
| 2023/0403021 A1* | 12/2023 | Francis | | H03F 3/21 |
| 2024/0072817 A1* | 2/2024 | K | | H03M 1/0609 |
| 2024/0080033 A1* | 3/2024 | Patil | | H03M 1/1047 |
| 2024/0305249 A1* | 9/2024 | Melanson | | H03F 3/2173 |

* cited by examiner

MITIGATING GAIN MISMATCH INTERFERENCE IN ANALOG-TO-DIGITAL CONVERTER CIRCUITRY

TECHNICAL FIELD

Examples of the present disclosure generally relate to mitigating interference in analog-to-digital converter (ADC) circuitry, and more particularly to mitigating interference associated with gain mismatch in chopping circuitry of ADC circuitry.

BACKGROUND

A communication system, or another electronic system, includes an analog-to-digital converter (ADC) circuitry that converts an analog signal to a digital signal. The analog signal is sampled based on a clock signal and quantized by the ADC circuitry at a frequency of Fs. To form a high speed radio frequency sampling, wideband ADC circuitry incorporate multiple sub-ADC circuitries that are interleaved. The sub-ADC circuitries operate at a slower frequency, than the overall combination of the interleaved sub-ADC circuitries. The sub-ADC circuitries calibrate interleaved offset, gain, and time-skew. The applied calibration techniques can be background or foreground calibration. Further, the applied calibration techniques can be in the analog domain or the digital domain.

The quantized signal output by each of the sub-ADC circuitries may be negatively affected by the mixing of the direct current (DC) content (or component) of an analog signal with the DC content of the ADC circuitry. To mitigate the mixing of the DC content (component) of an analog signal with the DC content of the ADC circuitry, chopping is applied to the analog signal. Chopping a signal includes multiplying the signal with a pseudo-random binary sequence (PRBS) of 1s and −1s (or 0s). The quantized signal output from the sub-ADC circuitry is un-chopped by multiplying the quantized signal with the PRBS. Further, the chopping and un-chopping process helps to distinguish the analog input signal which is at or near interleaving tones of the sub-ADC circuitries from interleaving tones generated by the sub-ADC circuitries. The analog signal may be a differential signal. In such an example, chopping the analog signal includes swapping the positive and negative side of the analog signal based on the PRBS via a series of direct switches and cross switches which are controlled by the polarity of the PRBS. However, gain mismatch (e.g., difference in transfer functions) between the direct switches and cross switches introduces interference (e.g., noise) that negatively affects the corresponding quantized signal. Accordingly, there is a need for sub-ADC circuitries that mitigate the effects of the gain mismatch between the direct and cross switches, improving the performance of the corresponding interleaved ADC circuitry.

SUMMARY

In one example, an analog-to-digital converter (ADC) circuitry includes a first channel. The first channel includes sub-ADC circuitry, amplitude detection circuitry, and correction circuitry. The sub-ADC circuitry receives input signals and outputs data signals. The amplitude detection circuitry is coupled to an output of the sub-ADC circuitry. The amplitude detection circuitry determines an amplitude difference between a first data signal of the data signals and a second data signal of the data signals. The amplitude detection circuitry outputs the amplitude difference as a difference signal. The correction circuitry is coupled to the output of the amplitude detection circuitry. The correction circuitry generates a first correction value based on the difference signal, and outputs the first correction value to adjust the data signals.

In one example, a method includes outputting data signals based on received input signal. The method further includes determining an amplitude difference between a first data signal of the data signals and a second data signal of the data signals and outputting the amplitude difference as a difference signal. Further, the method includes generating a first correction value based on the difference signal, and adjusting a third data signal of the data signals based on the first correction value.

In one example, an electronic system includes analog circuitry that outputs analog signals, ADC circuitry coupled to the analog circuitry, and digital circuitry coupled to the ADC circuitry. The ADC circuitry receives the analog signals and output digital signals. The ADC circuitry includes a plurality of ADC channels. A first ADC channel of the plurality of ADC channels includes sub-ADC circuitry, amplitude detection circuitry, and correction circuitry. The sub-ADC circuitry receives input signals and outputs data signals. The amplitude detection circuitry is coupled to an output of the sub-ADC circuitry. The amplitude detection circuitry determines an amplitude difference between a first data signal of the data signals and a second data signal of the data signals. The amplitude detection circuitry outputs the amplitude difference as a difference signal. The correction circuitry is coupled to the output of the amplitude detection circuitry. The correction circuitry generates a first correction value based on the difference signal, and outputs the first correction value to adjust the data signals. The digital circuitry receives the digital signals.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the features or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

A communication system, or another electronic system, includes an analog-to-digital converter (ADC) circuitry to convert data signals from an analog domain to a digital domain. Multiple sub-ADC circuitries are interleaved with each other to form a high speed ADC circuitry. Interleaving the sub-ADC circuitries allows for sub-ADC circuitries having a lower operating frequency to be used to form a high speed ADC circuitry (e.g., ADC circuitry that operates at a higher frequency than each sub-ADC circuitry). One problem that arises when using interleaved sub-ADC circuitries is that interleaving tones are produced in the output quantized signal due to the sub-ADC circuitry offsets. The interleaving tones occur at m*Fs/N, where Fs is the operating frequency of the sub-ADC circuitry, N is the interleaving factor, and m=0, 1, 2, ..., N−1. In one example, an input signal (IF) applied at, or around, the interleaving tones is difficult to distinguish from the interleaving tones. The difficulty is increased when the amplitude of the input signal is small (e.g., less than about −50 dBs).

To mitigate the effects of the interleaving tones, the input signal is scrambled during sampling before quantization and scrambled back to obtain the original signal after removing the ADC circuitry offsets. In one example, the input signal is a differential signal, and the scrambling process is achieved by chopping the input differential signal (e.g., swapping the positive and negative side of the differential input signal) during sampling using a pseudo-random binary sequence (PRBS). To swap the positive and negative side of the differential input signal, a pair of direct switches and a pair of cross switches are used. The direct switches connect the positive differential input signal to a positive sampling capacitor and the negative differential input signal to a negative sampling capacitor. The cross switches connect the positive differential input signal to the negative sampling capacitor and the negative differential input signal to the positive sampling capacitor. When the direct switches are enabled during a sampling event, the cross switches are disabled, and when the cross switches are enabled during a sampling event, the direct switches are disabled.

While the use of direct switches and cross switches may mitigate interleaving tones within the quantized signal, a gain mismatch (difference) between the states of sampling (e.g., enabling the direct or cross switches) occurs due to the differences in resistances or capacitances. The differences in resistances or capacitances are due to the layout and/or manufacturing variations used to form the direct and cross switches during the manufacturing process.

In one example, un-chopping a differential input signal (e.g., reversing the polarity of the differential input signal) occurs within the digital domain after removing the quantizer offsets to obtain the original input signal. However, the gain mismatch introduced in the analog domain is translated into interference (e.g., noise) in the output digital signal. In one or more examples when using chopping, the input signal is multiplied by 1 or −1 in the analog domain based on the PRBS. Further, to un-chop a signal, a quantized (or digital) signal is multiplied by the same PRBS in the digital domain. However, the gain mismatch may negatively affect (e.g., alter) the values of the input chopping process, such that the un-chopped signal does not reflect the values of the input data signal. For example, while the PRBS may have values of (1, −1), the gain mismatch causes the PRBS values used to chop the data to be (1, −0.9). Accordingly, the values of the digital signal do not match the values the input signal, and a portion of the input signal is converted into wide band noise, degrading the noise spectral density (NSD) due to the PRBS chopping.

In the following, a sub-ADC circuitry is described that mitigates the differences in gain between the direct and cross switches, improving the NSD of the corresponding communication system. In one example, the sub-ADC circuitry estimates the gain of the direct switches and the gain of the cross switches, and adjusts the quantized signal to mitigate gain differences between the direct and cross switches. For example, a difference in amplitude of the signals generated by the direct and cross switches is determined, and a correction value based on the amplitude difference is generated. The correction value is applied to an un-chopped quantized signal, mitigating the gain differences and improving the NSD of the corresponding communication system.

Figure 1:
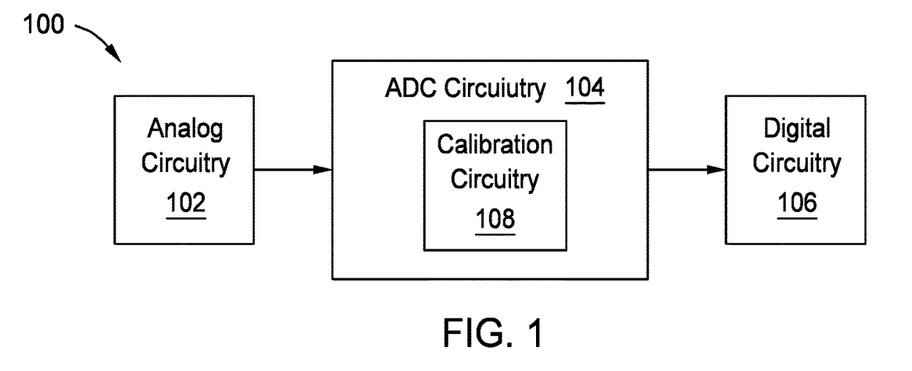
FIG. 1 illustrates a schematic block diagram of a communication system.

FIG. 1 is a block diagram depicting an electronic system 100 according to an example. The electronic system 100 includes analog circuitries 102, ADC circuitry 104, and digital circuitry 106. The analog circuitry 102 generates one or more analog signals as output (e.g., continuous time, continuous amplitude signals). The ADC circuitry 104 processes the analog signal(s) and generates one or more digital signals as output (e.g., discrete time, discrete amplitude signals). The digital circuitry 106 receives the digital signal(s) for further processing. For example, the analog circuitry 102 can be radio frequency (RF) circuitry, wireless communication circuitry, and/or sensors disposed on an integrated circuit (IC), such as temperature sensors, voltage sensors, current sensors, or the like. The ADC circuitry 104 and digital circuitries 106 can be part of communication circuitry, or monitor circuitry, or the like. It should be understood that there are a myriad of other applications for the ADC circuitry 104. In an example, the ADC circuitry 104 comprises a time-interleaved ADC that includes calibration circuitry 108. The calibration circuitry 108 is configured to perform digital calibration of interleaved offset and correction of gain differences between chopping switches, as describe further below.

Figure 2:
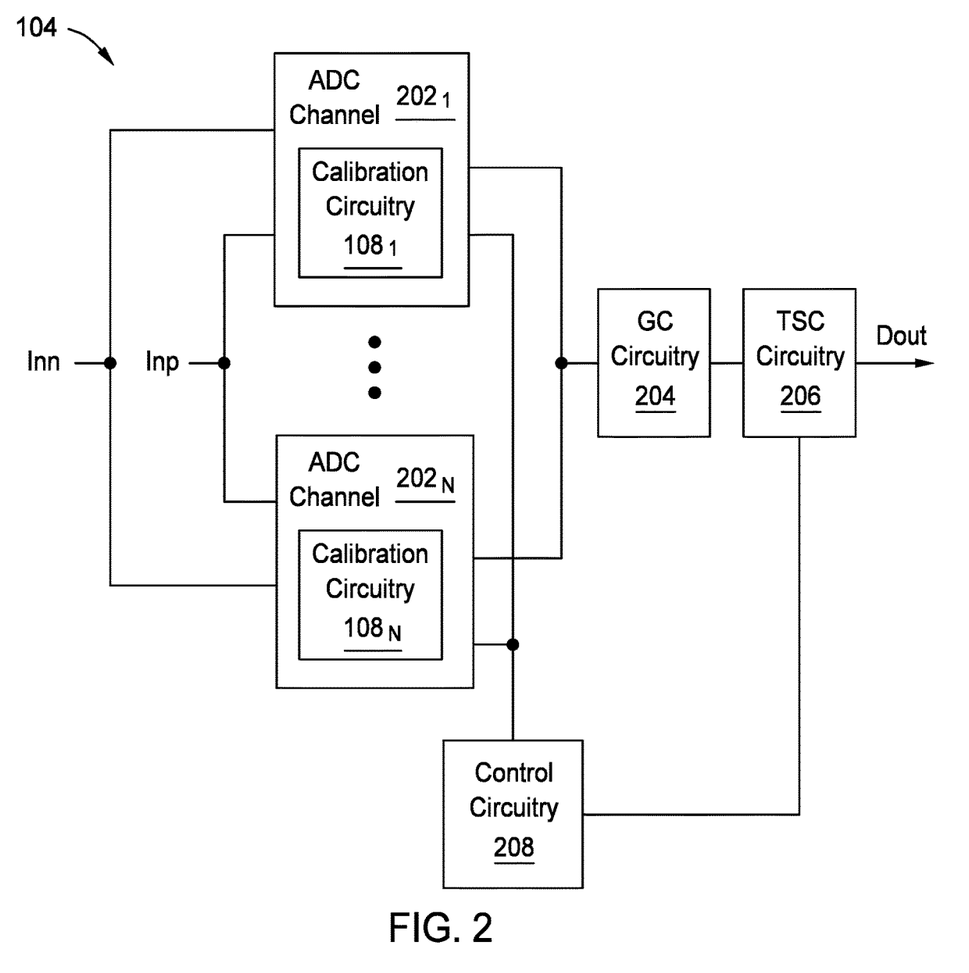
FIG. 2 illustrates a schematic block diagram of analog-to-digital converter (ADC) circuitry.

FIG. 2 is a block diagram depicting the ADC circuitry 104 according to an example. In the example, the ADC circuitry 104 receives a differential analog signal as input. The differential analog signal includes a positive component Inp and a negative component Inn. The ADC circuitry 104 includes a plurality of ADC channels, e.g., ADC channels $202_1 \ldots 202_N$, where N is an integer greater than one. The ADC circuitry 104 further includes a gain calibration (GC) circuitry 204 and a time-skew calibration (TSC) circuitry 206. Inputs of each ADC channel $202_1 \ldots 202_N$ receive the positive and negative components of the differential analog input signal. Digital outputs of the ADC channels $202_1 \ldots 202_N$ are coupled to an input of the GC circuitry 204. An output of the GC circuitry 204 is coupled to an input of the TSC circuitry 206. An output of the TSC circuitry 206 provides a digital output signal of the ADC circuitry 104. The ADC channels $202_1 \ldots 202_N$ include instances $108_1 \ldots 108_N$ of calibration circuitry (described further below). The ADC circuitry 104 further includes a control circuitry 208. An output of the control circuitry 208 is coupled to control inputs of each of the ADC channels $202_1 \ldots 202_N$.

In operation, the ADC channels $202_1 \ldots 202_N$ each sample the differential analog input signal. The ADC channels $202_1 \ldots 202_N$ receive clock signals from the control circuitry 208 and sample the differential analog signal in time-interleaved fashion. For example, each ADC channel 202 can sample the differential analog signal at a different phase of a given clock signal. For each ADC channel 202, the calibration circuitry 108 measures and removes the average of the output of the ADC channel 202. The calibration circuitry 108 operates as described further below. The GC circuitry 204 is configured to compare the root mean squared (RMS) power of each ADC channel 202 and adjust the outputs with respect to a reference. The TSC circuitry 206 measures the delta between consecutive samples output by the GC circuitry 204 and adjusts the delay of the clock signals output by the control circuitry 208.

Figure 3:
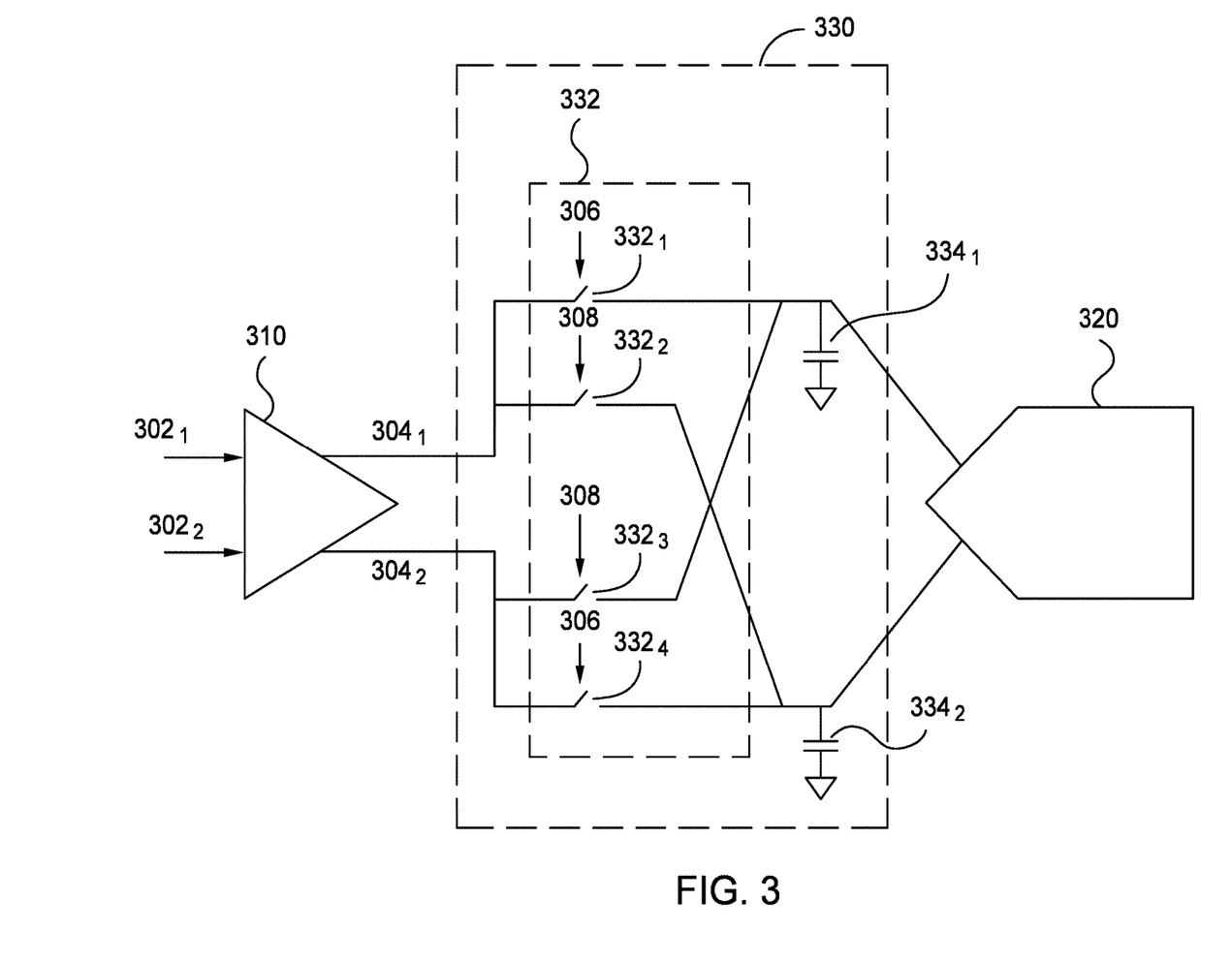
FIG. 3 illustrates a schematic block diagram of a portion of a communication system.

FIG. 3 illustrates buffer circuitry 310, sub-ADC circuitry 320, and chopping circuitry 330. The buffer circuitry 310 receives the differential input signal 302 and outputs the differential signal 304. The differential signal 304 includes a positive component $304_1$ (Inp) and a negative component $304_2$ (Inn). The chopping circuitry 330 receives the differential signal 304, and samples the differential signal 304 based on the control signals 306 and 308. The control signals 306 and 308 correspond to a PRBS signal. For example, the value and/or polarity of the control signal 306 and the control signal 308 are based on the polarity of the PRBS signal. Further, the value and/or polarity of the controls signal 306 differs from that of the control signal 308. In one example when the polarity of the PRBS signal is positive, the control signal 306 has a positive polarity and the control signal 308 has a value of zero or a negative polarity. Further, when the polarity of the PRBS signal is negative, the control signal 308 has a positive polarity and the control signal 306 has a value of zero or a negative polarity.

The chopping circuitry 330 includes switch circuitry 332 and sampling capacitors 334. The switch circuitry 332 includes switches $332_1$-$332_4$. The switches $332_1$ and $332_2$ receive the positive component $304_1$ of the differential signal 304 and the switches $332_3$ and $332_4$ receive the negative component $304_2$ of the differential signal 304. In one example, when the control signal 306 enables the switches $332_1$ and $332_4$, the control signal 308 disables the switches $332_2$ and $332_3$. Enabling the switch $332_1$ connects the positive component $304_1$ of the differential signal 304 with the sampling capacitor $334_1$, sampling the positive component $304_1$ of the differential signal 304 with the capacitor $334_1$. Enabling the switch $332_4$ connects the negative component $304_2$ of the differential signal 304 with the sampling capacitor $334_2$, sampling the negative component $304_2$ of the differential signal 304 with the capacitor $334_2$. Further, when the control signal 308 enables the switches $332_2$ and $332_3$, the control signal 306 disables the switches $332_1$ and $332_4$. Enabling the switch $332_2$ connects the positive component $304_1$ of the differential signal 304 with the sampling capacitor $334_2$, sampling the positive component $304_1$ of the differential signal 304 with the capacitor $334_2$. Enabling the switch $332_3$ connects the negative component $304_2$ of the differential signal 304 with the sampling capacitor $334_1$, sampling the negative component $304_2$ of the differential signal 304 with the capacitor $334_1$. In one or more examples, as control signal 306 and the control signal 308 are based on a PRBS signal, the control signal 306 enables the switches $332_1$ and $332_4$ when the value of the PRBS signal is a 1, and the control signal 308 enables the switches $332_2$ and $332_3$ when the value of the PRBS is a −1 (or 0).

In one example, the chopping circuitry 330 is included within each of the ADC channels 202 of FIG. 1 at the input of the corresponding sub-ADC circuitry.

The sub-ADC circuitry 320 receives the sampled signals from the capacitors $334_1$ and $334_2$ and generates a digital signal (e.g., a quantized signal). In one example, the sub-ADC circuitry 320 is included within each of the ADC channels 202. Further, the sub-ADC circuitry 320 includes the calibration circuitry 108.

In one or more examples, the on-switch resistance of the switches $332_1$ and $332_4$ differs from that of the switches $332_2$ and $332_3$. The difference in resistances is due to layout and/or process variations used form the switch circuitry 332. In one example, due to the differences in resistances between the switches, different transfer functions are applied to the differential signal 304 when the switches $332_1$ and $332_4$ are enabled, and switches $332_2$ and $332_3$ are enabled. One example transfer function that is affected is gain, which varies with the frequency of the differential signal 304. If the gain is the same between the switches $332_1$ and $332_4$ and $332_2$ and $332_3$, and no additional interference is introduced into the output signal. However, when the gain between the switches $332_1$ and $332_4$ and switches $332_2$ and $332_3$ is different, the difference in gain introduces noise (interference) when the output signal is un-chopped using the PRBS signal. For example, the switches $332_1$ and $332_4$ may apply a gain to the differential signal 304 that differs from that of the switches $332_2$ and $332_3$. Accordingly, the values sampled when the switches $332_1$ and $332_4$ are enabled have a different gain applied to them than values sampled when the switches $332_2$ and $332_3$ are enabled. Accordingly, when the un-chopping procedure is applied, the generated values may differ from the input values, introducing interference into the overall system.

Figure 4:
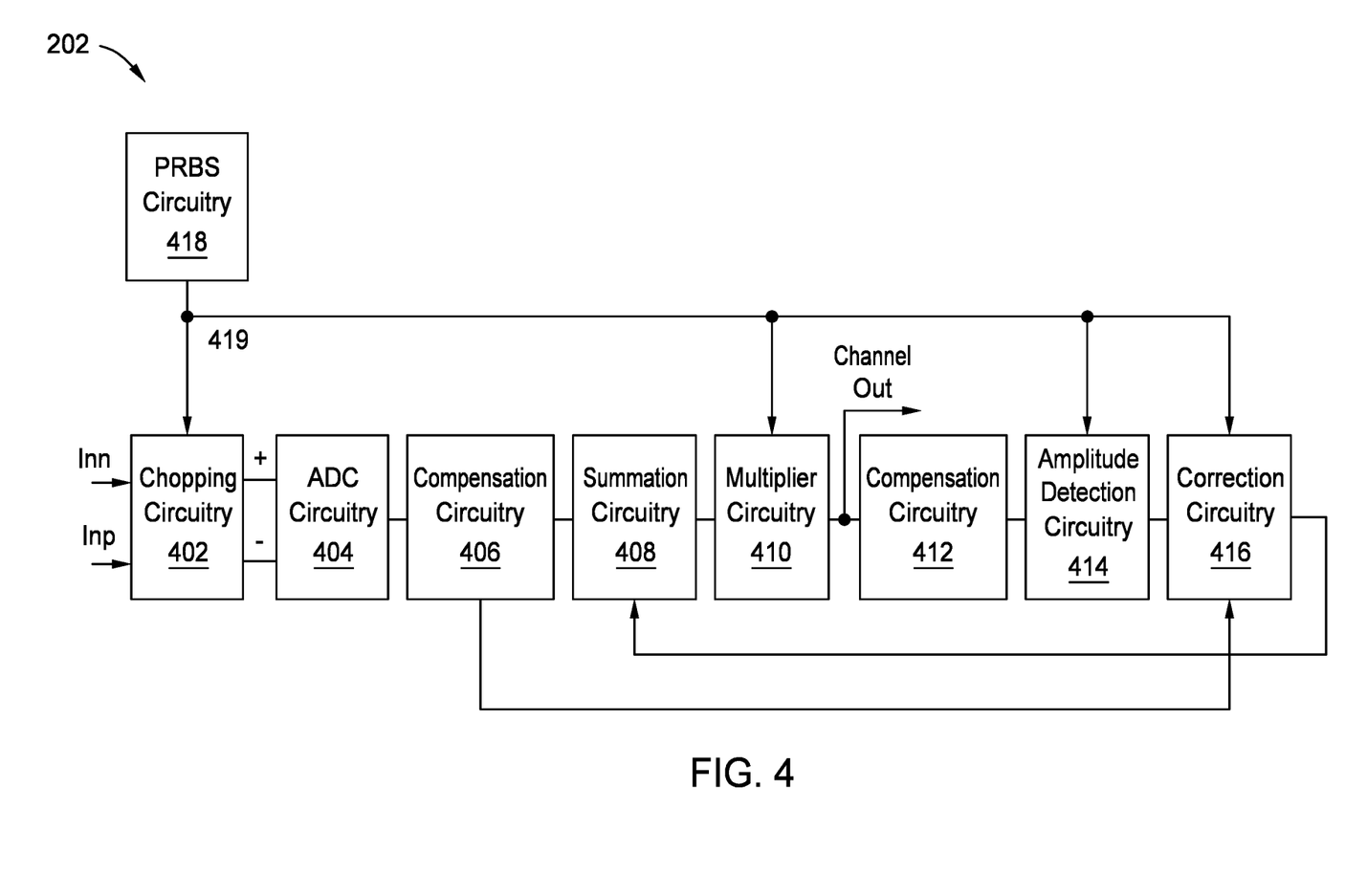
FIG. 4 illustrates a schematic block diagram of a portion of ADC circuitry.

FIG. 4 is a block diagram depicting an ADC channel 202 according to an example. The ADC channel 202 includes a chopping circuitry 402, sub-ADC circuitry 404, compensation circuitry 406, summation circuitry 408, multiplier circuitry 410, compensation circuitry 412, amplitude detection circuitry 414, correction circuitry 416, and PRBS circuitry 418.

Inputs of the chopping circuitry 402 receive the differential analog signal as input. In one example, the chopping circuitry 402 is configured similar to the chopping circuitry 330 of FIG. 3. A differential output of the chopping circuitry 402 is coupled to a differential input of the sub-ADC circuitry 404. An output of the sub-ADC circuitry 404 is coupled to an input of the compensation circuitry 406. An output of the compensation circuitry 406 is coupled to an input of the summation circuitry 408. Further, the output of the compensation circuitry 406 is connected to an input of the correction circuitry 416. The output of the summation circuitry 408 is coupled to an input of the multiplier circuitry 410. Further, an input of the summation circuitry 408 is coupled to an output of the correction circuitry 416.

An output of the multiplier circuitry 410 is coupled to an input of the compensation circuitry 412. An output of the compensation circuitry 412 is coupled to an input of the amplitude detection circuitry 414. An output of the amplitude detection circuitry 414 is coupled to an input of the correction circuitry 416. An input of the correction circuitry 416 is further connected to an output of the compensation circuitry 406. Data is output from the ADC channel via the channel out at the output of the multiplier circuitry 410. The PRBS signal 419 output by the PRBS circuitry 418 is coupled to an input of the chopping circuitry 402, an input of the multiplier circuitry 410, input of the amplitude detection circuitry 414, and an input of the correction circuitry 416.

In operation, the chopping circuitry 402 samples the differential analog input signal. The chopping circuitry 402 alternates coupling Inn and Inp to the non-inverting (+) and inverting (−) terminals of the sub-ADC circuitry 404 based on the PRBS signal 419. In one or more examples, the chopping circuitry 402 functions as described with regard to the chopping circuitry 330 of FIG. 3. In this manner, the values of the digital signal output by the sub-ADC circuitry 404 are randomized. In one or more examples, the chopping circuitry 402 prevents the analog input signal at the sampling frequency of the ADC channel 202 from being seen as DC.

Figure 5:
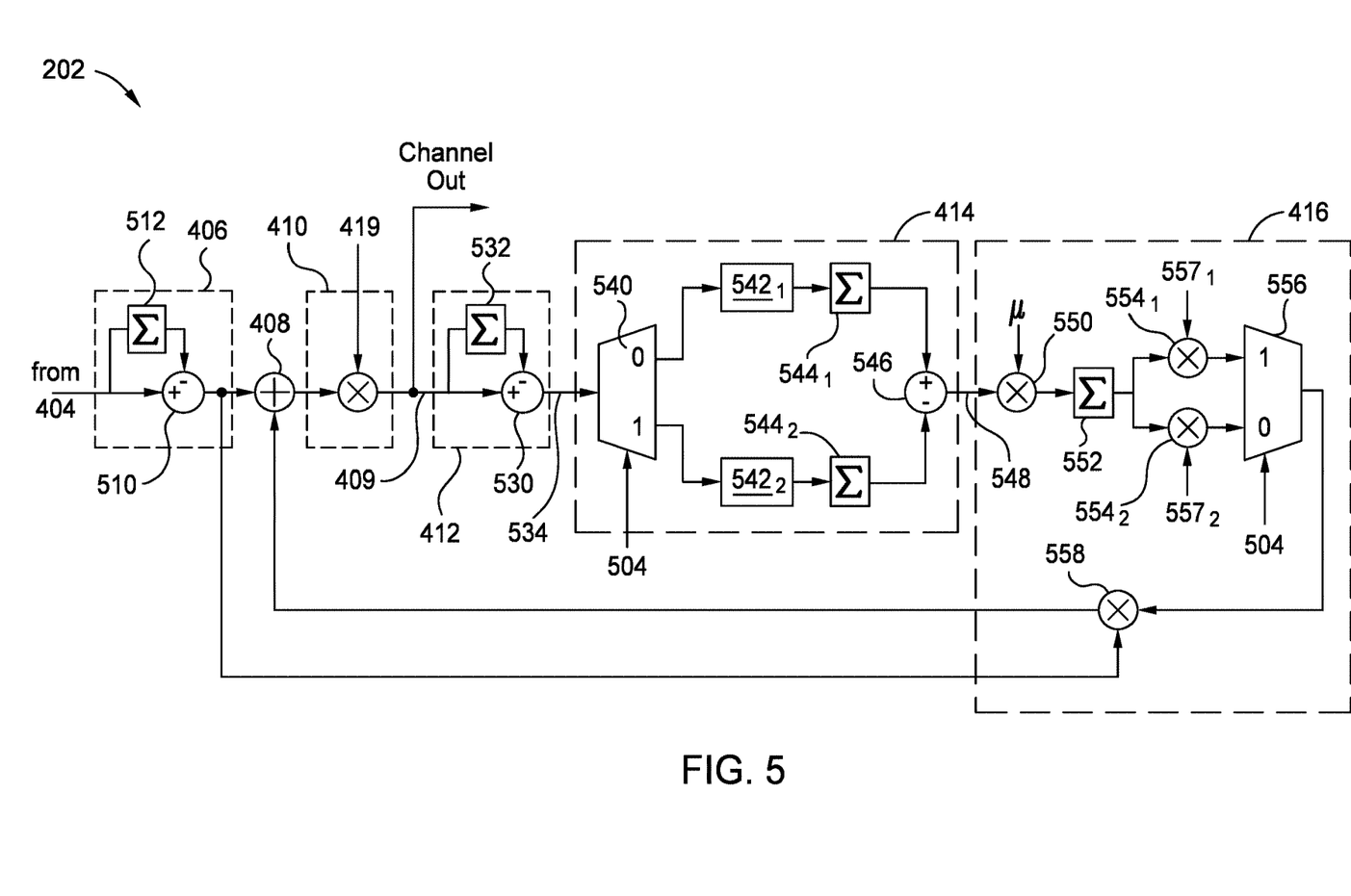
FIG. 5 illustrates a schematic block diagram of a portion of ADC circuitry.

The compensation circuitry 406 removes the DC offset of the sub-ADC circuitry 404. As is illustrated in FIG. 5, the compensation circuitry 406 includes combination circuitry 510 and accumulation circuitry 512. The accumulation circuitry 512 accumulates values of the signal output by the sub-ADC circuitry 404, the inverse of which is summed with the signal output by the sub-ADC circuitry 404 by the combination circuitry 510. The output of the compensation circuitry 406, e.g., the output of the combination circuitry 510, is output to the correction circuitry 416 and the summation circuitry 408. The summation circuitry 408 sums the output of the correction circuitry 416 with the output of the compensation circuitry 406.

The multiplier circuitry 410 "un-chops" the output of the compensation circuitry 406 using the same PRBS signal (e.g., PRBS signal 419) as used during the chopping process. In addition to enabling the presence of signals at the interleaving tones, this configuration also has the capability of reducing the effect of flicker noise by scrambling the flicker noise coming from the sub-ADC circuitry 404. The compensation circuitry 412 removes the residual differential offset introduced at the input of the chopping circuitry 402.

The compensation circuitry 412 includes combination circuitry 530 and accumulation circuitry 532. The accumulation circuitry 532 accumulates values of the signal 409 output by the multiplier circuitry 410. The accumulated value(s) are combined with the signal 409 by the combination circuitry 530. The output of the combination circuitry 530 is output to the amplitude detection circuitry 414.

In one example, the amplitude detection circuitry 414 separates the output of compensation circuitry 412 into a first signal stream (e.g., signal path) and second signal stream based on the polarity the chop bit of the PRBS signal 419. With reference to FIG. 3, a first signal stream corresponds to the switches $332_1$ and $332_4$ (e.g., direct switches) being enabled, and the second signal stream corresponds to the switches $332_2$ and $332_3$ (e.g., cross switches) being enabled. In one example, the first signal stream corresponds to a chop bit of 1 (or a chop bit value of 1) and the second signal stream corresponds to a chop bit of −1 (or a chop bit value of 0). In one example, an average amplitude value of each stream is determined by the amplitude detection circuitry 414. In one example, the amplitude detection circuitry 414 determines an absolute value of each stream and accumulates the absolute values of each stream over a S samples. S is greater than one. In one example, S is ten, one hundred, one thousand, or one million, or more. In another example, the amplitude detection circuitry 414 determines an average amplitude value of each stream by determining the power of each stream by squaring the value of each stream, and accumulating the squared value. In one or more examples, the accumulated sum is passed through a mean function to determine an average amplitude value. In one example, for $2^{20}$ accumulated samples, the mean is determined by right shifting the results by 20 bits. If there is no gain mismatch in the chopping circuitry 402, the difference between the average amplitude value of each stream is the same. A gain mismatch exists within the chopping circuitry 402 when a difference is determined between the average amplitude value of each stream.

FIG. 5 illustrates an example implementation of the amplitude detection circuitry 414. For example as illustrated by FIG. 5, the amplitude detection circuitry 414 includes demultiplexer 540, absolute value circuitries $542_1$, $542_2$, accumulation circuitries $544_1$, $544_2$, and combination circuitry 546. In one example, the absolute value circuitry $542_1$, and the accumulation circuitry $544_1$ correspond to first signal stream (or path), and the absolute value circuitry $542_2$, and the accumulation circuitry $544_2$ correspond to second signal stream (or path). The accumulation circuitries 544 continuously accumulate values output by the corresponding absolute value circuitries 542. In one example, the demultiplexer 540 receives the signal 534 output from the compensation circuitry 412, and directs (e.g., selectively couples), the signal to either the absolute value circuitry $542_1$ or the absolute value circuitry $542_2$ based on the control signal 504. The control signal 504 is based on a chop bit signal, which corresponds to the polarity of the PRBS signal 419. For example, the control signal has a value of 0 when the PRBS signal 419 has a positive polarity (e.g., a value of 1), and the control signal has a value of 1 when the PRBS signal 419 has a negative polarity (e.g., a value of −1).

Based on the control signal 504 having a value of 0, the demultiplexer 540 connects the signal 534 output by the compensation circuitry 412 to the absolute value circuitry $542_1$, the output of which is accumulated within the accumulation circuitry $544_1$. Based on the control signal having a value of 1, the demultiplexer 540 connects the signal 534 to the absolute value circuitry $542_2$, the output of which is accumulated within the accumulation circuitry $544_2$. In one or more examples, with reference to FIG. 3, when the switches $332_1$ and $332_4$ (e.g., direct switches) are enabled, the demultiplexer 540 outputs the signal 534 to the absolute value circuitry $542_1$, and when the switches $332_2$ and $332_3$ (e.g., cross switches) are enabled, the demultiplexer 540 outputs the signal 534 to the absolute value circuitry $542_2$.

The combination circuitry 546 subtracts the output of the accumulation circuitry $544_1$ from the output of the accumulation circuitry $544_2$ to generate the difference signal 548.

The correction circuitry 416 receives the output (e.g., the difference signal 548) of the amplitude detection circuitry 414. The correction circuitry 416 multiplies the output of the amplitude detection circuitry 414 by a constant value to determine an updated value and accumulates the updated value. The updated value corresponds to the gain mismatch within the chopping circuitry 402. The correction circuitry 416 determines a correction value or values based on the accumulated values. The correction value or values are combined (e.g., multiplied) with the output of the compensation circuitry 406 and then combined (e.g., summed) with the output of the compensation circuitry 406, to mitigate gain mismatch within the chopping circuitry 402.

As illustrated by FIG. 5, the correction circuitry 416 includes multiplier circuitry 550, accumulation circuitry 552, multiplier circuitries $554_1$, $554_2$, multiplexer 556, and multiplier circuitry 558. The multiplier circuitry 550 multiplies the difference signal 548 with the constant µ. The value of the constant µ provides loop stability, is based on the settling time, and/or is based on the granularity of the gain correction. The output of the multiplier circuitry 550 is received by the accumulation circuitry 552. The accumulation circuitry 552 provides continuous accumulation of the output of the multiplier circuitry 550. The accumulation circuitry 552 outputs a signal to the multiplier circuitry $554_1$ and the multiplier circuitry $554_2$. The multiplier circuitry $554_1$ multiplies the output of the accumulation circuitry 552 by factor $557_1$, and the multiplier circuitry $554_2$ multiplies the output of the accumulation circuitry 552 by factor $557_2$. In one example, the factor $557_1$ has a value of ½ and the factor $557_2$ has a value of −½. Using factors $557_1$ and $557_2$ with such values ensures that a DC balance is maintained within the ADC channel due to the switch states of the chopping circuitry 402. In other example, the factor $557_1$ has a value of 1 and the factor $557_2$ has a value of −1. In yet other examples, the factors $557_1$ and $557_2$ may have other values. Further, in one or more examples, the polarity of the factors $557_1$ and $557_2$ differ from each other. Further, the magnitude of the factors $557_1$ and $557_2$ may or may not be equal to each other.

A first input of the multiplexer 556 is coupled to and receives the output from the multiplier circuitry $554_1$ and the second input of the multiplexer 556 is coupled to and receives the output from the multiplier circuitry $554_2$. The multiplexer 556 further receives the control signal 504. The multiplexer 556 outputs the signal output by the multiplier circuitry $554_1$ based on the control signal 504 having a value of 1, and outputs the signal output by the multiplier circuitry $554_2$ based on the control signal 504 having a value of 0. As the control signal 504 corresponds to the polarity of the PRBS signal 419, the multiplexer 556 outputs the signal output by the multiplier circuitry $554_1$ based on the PRBS signal 419 having a negative polarity, and the multiplexer 556 outputs the signal output by the multiplier circuitry $554_2$ based on the PRBS signal 419 having a positive polarity. Further with reference to FIG. 3, when the switches $332_1$ and $332_4$ (e.g., direct switches) are enabled, the multiplexer 556 outputs the signal output by the multiplier circuitry $554_2$, and when the switches $332_2$ and $332_3$ (e.g., cross switches) are enabled, the multiplexer 556 outputs the signal output by the multiplier circuitry $554_1$. The output of the multiplexer 556 is received by the multiplier circuitry 558 and multiplied with the output of the compensation circuitry 406 to generate a correction value. The correction value is output by the multiplier circuitry 558 to the summation circuitry 408, where the correction value is added to the output of the compensation circuitry 406. As the input to the multiplier circuitry 558 is controlled by the control signal 504, which is based on the polarity of the PRBS signal 419, when the polarity of the PRBS signal 419 changes, the polarity of the output of the multiplier circuitry 558 changes accordingly to match the polarity of the PRBS signal 419. The summation circuitry 408 adds or subtracts a correction value from the output of the compensation circuitry 406 based on the polarity of the PRBS signal 419, and the state of the switches of the chopping circuitry 402. Accordingly, interference within the output of the sub-ADC circuitry 404 due to gain mismatch within the chopping circuitry 402, improving the NSD and performance of the corresponding system.

In one or more examples, each of the ADC channels 202 is configured similar to ADC channel 202 of FIG. 4. Further, while FIG. 5 illustrates a specific configuration for the amplitude detection circuitry 414 and the correction circuitry 416, in other examples, the amplitude detection circuitry 414 and/or the correction circuitry 416 may have other configurations. For example, the elements of the amplitude detection circuitry 414 may differ from that illustrated in FIG. 5, such that the elements are able to determine amplitude differences. Further, the elements of the correction circuitry 416 may differ from that illustrated in FIG. 5, such that the elements are able to generate correction values from the amplitude differences determined by the amplitude detection circuitry 414.

Figure 6:
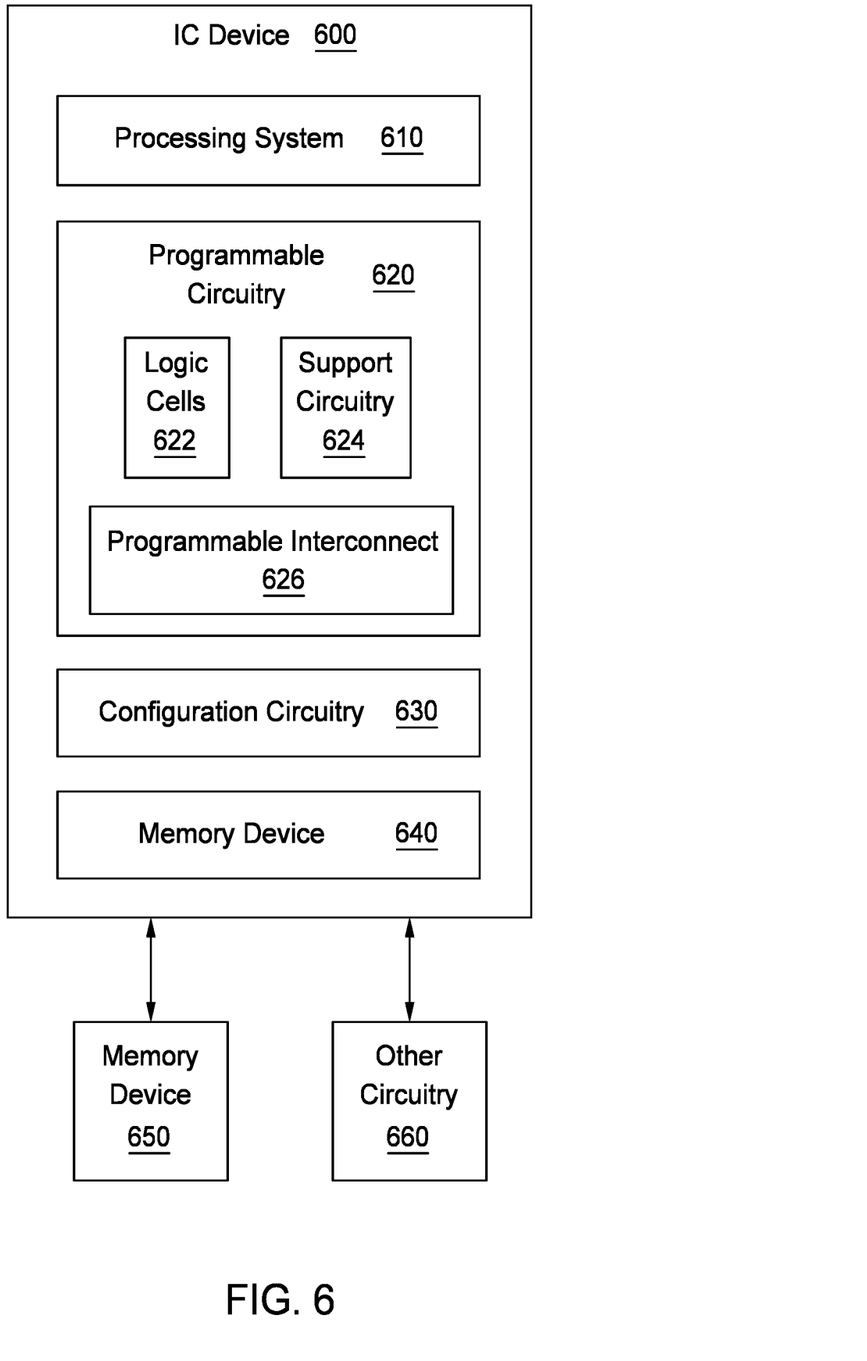
FIG. 6 illustrates a schematic block diagram of an integrated circuit device.

FIG. 6 is a block diagram of an integrated circuit (IC) device 600 according to an example in which the ADC circuitry 104 described herein is implemented within. In one example, the ADC circuitry 104 is integrated across multiple IC devices 600. In one example, one or more elements of the ADC circuitry 104 is implemented within the processing system 610 and/or the programmable circuitry 620. The IC device 600 includes processing system 610, programmable circuitry 620 configuration circuitry 630, and memory device 640. The IC device 600 can be coupled to external circuits, such as memory device 650, and other circuitry 660. The programmable circuitry 620 includes logic cells 622, support circuitry 624, and programmable interconnect 626. The logic cells 622 include circuits that can be configured to implement general logic functions of a plurality of inputs. The support circuitry 624 includes dedicated circuits, such as transceivers, input/output blocks, digital signal processors, and/or memories, and the like. The logic cells 622 and the support circuitry 624 can be interconnected using the programmable interconnect 626. Configuration information for programming the logic cells 622, for setting parameters of the support circuitry 624, and for programming the programmable interconnect 626 is stored in the memory device 640 by the configuration circuitry 630. The configuration circuitry 630 obtains the configuration data from the memory device 650 or any other source (e.g., from the other circuitry 660). The processing system 610 includes microprocessor(s), memory, support circuits, IO circuits, and the like. While FIG. 6 illustrates one example embodiment of an IC device, in other examples, an IC device may have other configurations. For example, an IC device may omit one or more of the processing system 610, the programmable circuitry 620, the configuration circuitry 630, and/or the memory device 640. Further, an IC device may include additional elements not included within the IC device 600 of FIG. 6.

Figure 7:
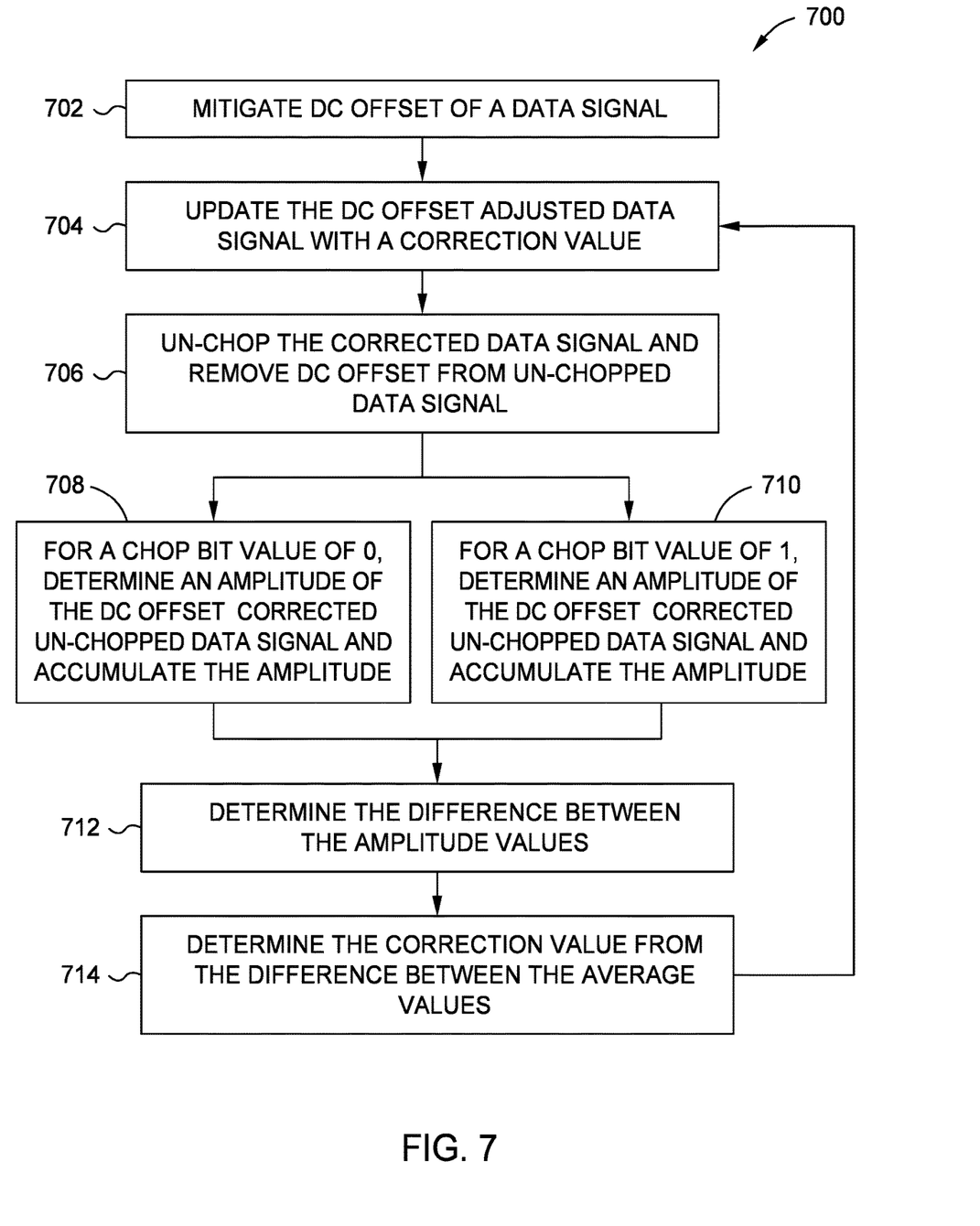
FIG. 7 illustrates a flowchart of a method for mitigating gain mismatch in ADC circuitry.

FIG. 7 illustrates a flowchart of a method 700 for mitigating gain mismatch within ADC circuitry. The method 700 is performed by ADC circuitry, e.g., the ADC circuitry 104 of FIG. 1.

At 702 of the method 700, a DC offset is mitigated from a data signal. For example, with reference to FIG. 4, the compensation circuitry 406 mitigates a DC offset from a data signal output by the sub-ADC circuitry 404 to generate a DC offset adjusted data signal. In one example to mitigate the DC offset, a difference between the data signal and an accumulated value of the data signal is determined.

At 704 of the method 700, the DC offset adjusted data signal is updated with a correction value. For example, with reference to FIG. 4, the summation circuitry 408 adds the output of the compensation circuitry 406 with a correction value determined by the correction circuitry 416 to generate a corrected data signal.

At 706 of the method 700, the corrected data signal is un-chopped, and a DC offset is removed from the un-chopped data signal. For example, with reference to FIG. 4, the multiplier circuitry 410 multiplies the output of the summation circuitry 408 (e.g., the corrected data signal) with a value of the PRBS signal 419 to generate an un-chopped data signal. The un-chopped data signal is output the compensation circuitry 412 that mitigates a DC offset within the un-chopped data signal. In one example to mitigate the DC offset, a difference between the un-chopped data signal and an accumulated value of the un-chopped data signal is determined.

At 708 of the method 700, an amplitude of the DC offset corrected un-chopped data signal is determined for a chop bit value of 0 and the amplitude is accumulated. For example with reference to FIG. 5, the demultiplexer 540 outputs the output of the compensation circuitry 412 to the absolute value circuitry $542_1$, and the output of the absolute value circuitry $542_1$ is output to the accumulation circuitry $544_1$ to determine an average of the signal output by the compensation circuitry 412 based on the chop bit value of 0. In one example, an average of the amplitude of the signal output by the compensation circuitry 412, e.g., signal 534, is determined and accumulated.

At 710 of the method 700, an amplitude of the DC offset corrected un-chopped data signal is determined for a chop bit value of 1 and the amplitude is accumulated. For example with reference to FIG. 5, the demultiplexer 540 outputs the output of the compensation circuitry 412 to the absolute value circuitry $542_2$, and the output of the absolute value circuitry $542_2$ is output to the accumulation circuitry $544_2$ to determine an amplitude of the signal output by the compensation circuitry 412 based on the chop bit value of 1. In one example, an average of the amplitude of the signal output by the compensation circuitry 412, e.g., signal 534, is determined and accumulated.

In one example, 708 and 710 of the method 700 are performed on multiple un-chopped data signals based on the chop bit value, accumulating the determined amplitudes.

At 712 of the method 700, a difference between the amplitude values is determined. For example, with reference to FIG. 5, the combination circuitry 546 subtracts the output of the accumulation circuitry $544_1$ (e.g., a first amplitude signal) from the output of the accumulation circuitry $544_2$ (e.g., a second amplitude signal). The combination circuitry 546 outputs a difference signal 548.

At 714 of the method 700, the correction value is determined from the difference between the average amplitude values. For example, the correction circuitry 416 determines the correction value based on the difference signal 548. In one example, the correction circuitry 416 multiplies the difference signal 548 with a constant (e.g., constant μ), and accumulates the output of the multiplication. An accumulated value is multiplied by a first factor to generate a first adjusted signal and a second factor to generate a second adjusted signal. The polarity of the first factor is opposite that the polarity of the second factor. In one example, the first factor is associated with the value of the PRBS signal 419 having a value of −1 (or a negative polarity), and the second factor is associated with the value of the PRBS signal 419 having a value of 1 (or a positive polarity). The correction circuitry 416 selects one of the first adjusted signal and the second adjusted signal based on the polarity of the PRBS signal 419 (e.g., a value of the control signal 504). For example, based on the PRBS signal 419 having a positive polarity, the correction circuitry 416 selects and outputs the second adjusted signal. Based on the PRBS signal 419 having a negative polarity, the correction circuitry 416 selects and outputs the first adjusted signal. With reference to FIG. 3, the polarity of the PRBS signal 419 corresponds to whether the switches $332_1$ and $332_4$ or the switches $332_2$ or $332_3$ are enabled. Accordingly, by selecting and outputting the first and second adjusted signals based on the polarity of the PRBS signal 419, the selected one of the first and second adjusted signals corresponds to which of the switches $332_1$ and $332_4$ or the switches $332_2$ or $332_3$ are enabled, and the correct correction value is output and used for mitigation of gain mismatch.

In one example, the correction circuitry 416 combines the selected one of the first and second adjusted signals with the DC offset adjusted signal determined at 702 of the method 700 to generate a correction value. In one example, combining the signals includes multiplying the signals. In other examples, the signals may be combined in other ways. The correction value is output and used to update the DC offset adjusted signal at 704 of the method 700.

In one or more examples, the method 700 continuously runs to mitigate interference introduced by gain mismatch between the switches $332_1$ and $332_4$ and the switches $332_2$ or $332_3$.

Figure 8:
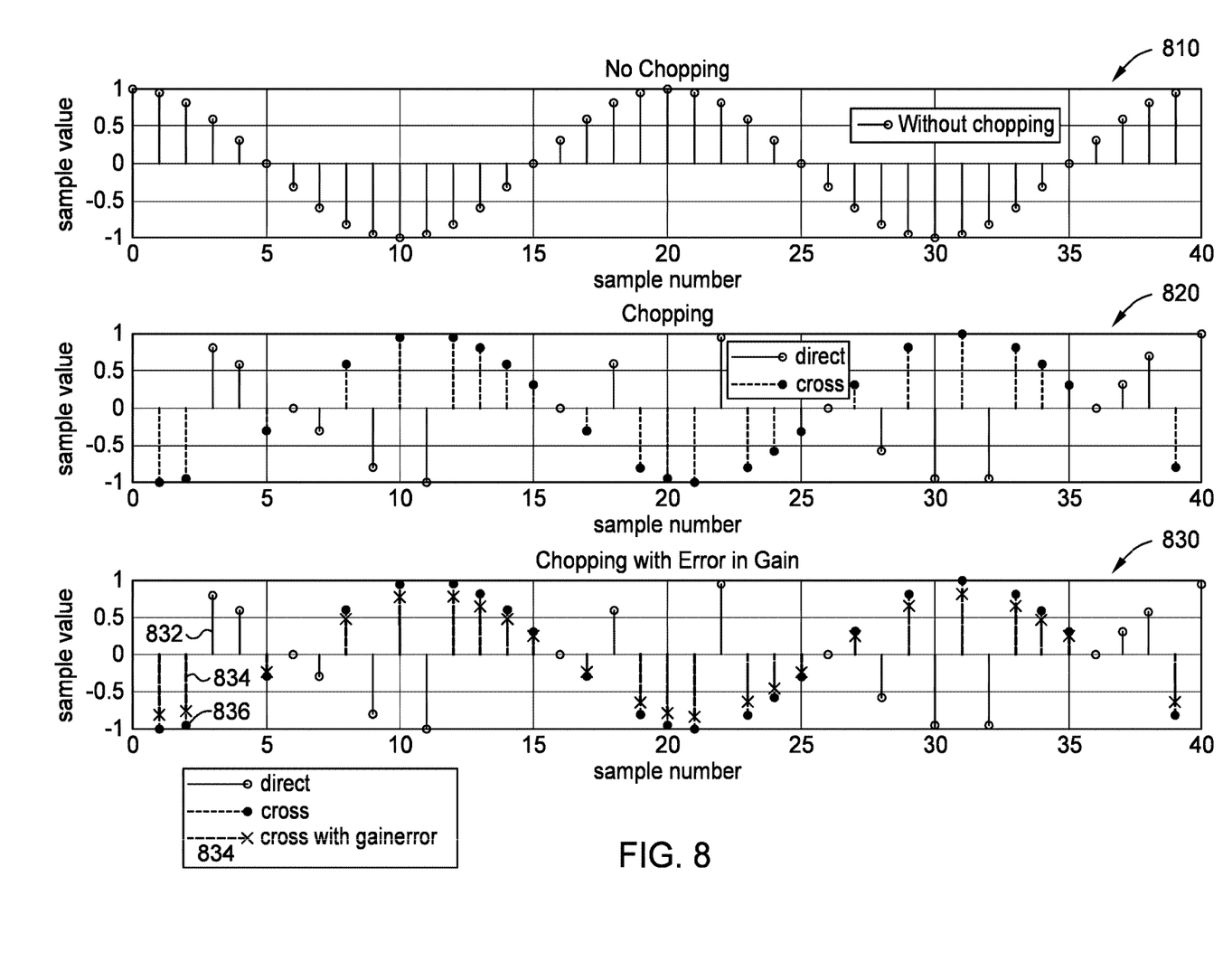
FIG. 8 illustrates graphs of sampled values before and after chopping is applied to a signal with and without effects of interference due to gain mismatch.

FIG. 8 illustrates graphs 810, 820, and 830. Graph 810 illustrates sampled values without chopping applied. Graph 820 illustrates sampled values with chopping applied. As can be seen in graph 820 as compared to graph 810, the polarity of the samples is randomized based on the polarity of the PRBS signal. Graph 830 illustrates sampled values with chopping applied, and when gain mismatch is present between the chopping switches (e.g., switch circuitry 332 of FIG. 3). In graph 830, sampled values 832 correspond to when the direct switches (e.g., switches $332_1$ and $332_4$ of FIG. 3) are enabled, the sampled values 834 correspond to when the cross switches (e.g., switches $332_2$ and $332_3$ of FIG. 3) are enabled with gain mismatch error, and the sampled values 836 correspond to when the cross switches (e.g., switches $332_2$ and $332_3$ of FIG. 3) are enabled without gain mismatch error. As can be seen in graph 830, the absolute value of the sampled values 834 differs from that of the absolute value of the sampled values 836, due to the gain mismatch error. Accordingly, when the sampled values are un-chopped, the sampled values 834 will introduce interface as the values of un-chopped signal will differ from that of the input signal.

Figure 9:
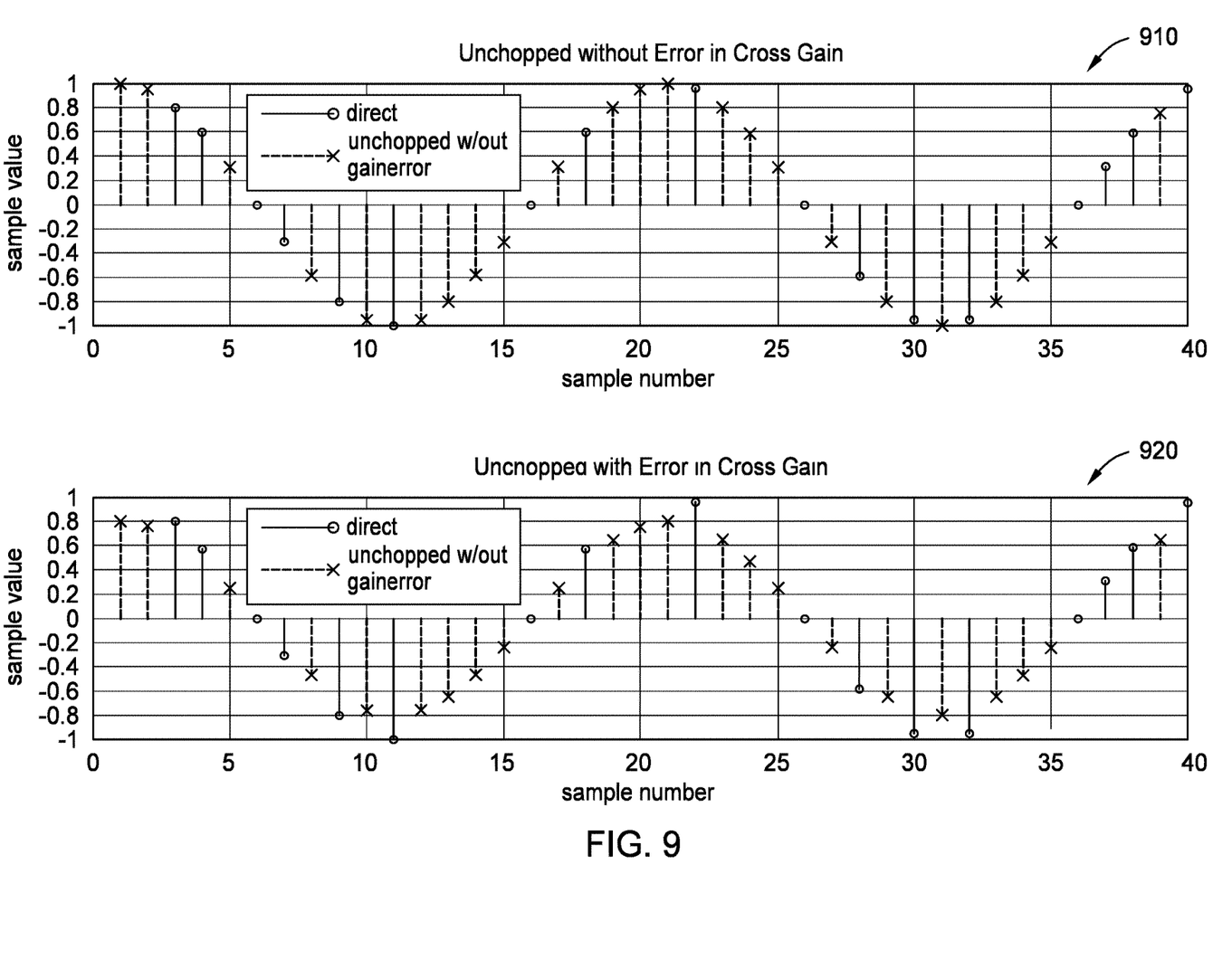
FIG. 9 illustrates graphs of sampled values after un-chopping is applied to a signal with and without effects of interference due to gain mismatch.

FIG. 9 illustrates graphs 910 and 920. The graph 910 illustrates sampled values that are generated by un-chopping chopped values that are not affected by gain mismatch. For example, the graph 910 may be generated from the sampled values of graph 820. The graph 920 illustrates sampled values that are generated by un-chopping chopped values that are affected by gain mismatch. For example, the graph 920 may be generated from the sampled values of graph 830. One or more of the sampled values of the graph 920 have a different value than a corresponding sampled value in the graph 910. The difference in the values is caused by the gain mismatch in the chopping switches. The gain mismatch may be mitigated by using the method 700 of FIG. 7.

In the above, sub-ADC circuitry is described that mitigates the differences in gain between the direct chopping switches and cross chopping switches, improving the NSD of the corresponding communication system. The sub-ADC circuitry estimates the gain of the direct chopping switches and the gain of the cross chopping switches, and adjusts the quantized signal to mitigate gain differences between the direct and cross switches. For example, a difference in amplitude of the signals generated by the direct and cross chopping switches is determined, and a correction value based on the amplitude difference is generated. The correction value is applied to an un-chopped quantized signal, mitigating the gain differences and improving the NSD of the corresponding communication system.

While the foregoing is directed to specific examples, other and further examples may be devised without departing from the basic scope thereof, and the scope thereof is determined by the claims that follow.

What is claimed is:

1. An analog-to-digital converter (ADC) circuitry comprising:
   a first channel comprising:
      sub-ADC circuitry configured to receiving input signals and output data signals;
      amplitude detection circuitry coupled to an output of the sub-ADC circuitry and configured to determine an amplitude difference between a first data signal of the data signals and a second data signal of the data signals, and output the amplitude difference as a difference signal; and
      correction circuitry coupled to an output of the amplitude detection circuitry and configured to generate a first correction value based on the difference signal, and output the first correction value to adjust the data signals.

2. The ADC circuitry of claim 1, wherein the amplitude detection circuitry is further configured to:
   determine, based on a pseudo-random binary sequence (PRBS) signal having a first polarity, a first amplitude of the first data signal; and
   determine, based on the PRBS signal having a second polarity, a second amplitude of the second data signal, wherein the first polarity differs from the second polarity, and wherein determining the amplitude difference between the first data signal and the second data signal comprises determining a difference between the first amplitude and the second amplitude.

3. The ADC circuitry of claim 2, wherein generating the first correction value based on the difference signal comprises:
   multiplying the difference signal by a first constant value to generate a first constant signal; and
   multiplying the first constant signal with a first factor to generate a first adjusted signal and a second factor to generate a second adjusted signal.

4. The ADC circuitry of claim 3, wherein a polarity of the first factor differs from a polarity of the second factor.

5. The ADC circuitry of claim 4, wherein a magnitude of a value of the first factor differs from a magnitude of a value of the second factor.

6. The ADC circuitry of claim 3, wherein generating the first correction value based on the difference signal further comprises:
   selecting one of the first adjusted signal and the second adjusted signal based on a polarity of the PRBS signal; and
   multiplying the selected one of the first adjusted signal and the second adjusted signal with a third data signal of the data signals.

7. The ADC circuitry of claim 6, wherein selecting one of the first adjusted signal and the second adjusted signal based on the polarity of the PRBS signal comprises:
   selecting the first adjusted signal based on the PRBS signal having the second polarity; and
   selecting the second adjusted signal based on the PRBS signal having the first polarity.

8. A method comprises:
   outputting data signals based on received input signals;
   determining an amplitude difference between a first data signal of the data signals and a second data signal of the data signals and outputting the amplitude difference as a difference signal;
   generating a first correction value based on the difference signal; and
   adjusting a third data signal of the data signals based on the first correction value.

9. The method of claim 8 further comprising:
   determining, based on a pseudo-random binary sequence (PRBS) signal having a first polarity, a first amplitude of the first data signal; and
   determining, based on the PRBS signal having a second polarity, a second amplitude of the second data signal, wherein the first polarity differs from the second polarity, and wherein determining the amplitude difference between the first data signal and the second data signal comprises determining a difference between the first amplitude and the second amplitude.

10. The method of claim 9, wherein generating the first correction value based on the difference signal comprises:
    multiplying the difference signal by a first constant value to generate a first constant signal; and
    multiplying the first constant signal with a first factor to generate a first adjusted signal and a second factor to generate a second adjusted signal.

11. The method of claim 10, wherein a polarity of the first factor differs from a polarity of the second factor.

12. The method of claim 10, wherein a magnitude of a value of the first factor differs from a magnitude of a value of the second factor.

13. The method of claim 10, wherein generating the first correction value based on the difference signal further comprises:
    selecting one of the first adjusted signal and the second adjusted signal based on a polarity of the PRBS signal; and
    multiplying the selected one of the first adjusted signal and the second adjusted signal with a third data signal of the data signals.

14. The method of claim 13, wherein selecting one of the first adjusted signal and the second adjusted signal based on the polarity of the PRBS signal comprises:
    selecting the first adjusted signal based on the PRBS signal having the second polarity; and
    selecting the second adjusted signal based on the PRBS signal having the first polarity.

15. An electronic system comprising:
    analog circuitry configured to output analog signals;
    analog-to-digital converter (ADC) circuitry coupled to the analog circuitry, and configured to receive the analog signals and output digital signals, wherein the ADC circuitry comprises a plurality of ADC channels, a first ADC channel of the plurality of ADC channels comprises:
       sub-ADC circuitry configured to receive input signals and output data signals;

amplitude detection circuitry coupled to an output of the sub-ADC circuitry and configured to determine an amplitude difference between a first data signal of the data signals and a second data signal of the data signals, and output the amplitude difference as a difference signal; and correction circuitry coupled to the output of the amplitude detection circuitry and configured to generate a first correction value based on the difference signal, and output the first correction value to adjust the data signals; and digital circuitry coupled to the ADC circuitry and configured to receive the digital signals.

16. The electronic system of claim 15, wherein the amplitude detection circuitry is further configured to:

determine, based on a pseudo-random binary sequence (PRBS) signal having a first polarity, a first amplitude of the first data signal; and determine, based on the PRBS signal having a second polarity, a second amplitude of the second data signal, wherein the first polarity differs from the second polarity, and wherein determining the amplitude difference between the first data signal and the second data signal comprises determining a difference between the first amplitude and the second amplitude.

17. The electronic system of claim 16, wherein generating the first correction value based on the difference signal comprises:

multiplying the difference signal by a first constant value to generate a first constant signal; and multiplying the first constant signal with a first factor to generate a first adjusted signal and a second factor to generate a second adjusted signal.

18. The electronic system of claim 17, wherein at least one of a polarity of the first factor differs from a polarity of the second factor, or a magnitude of a value of the first factor differs from a magnitude of a value of the second factor.

19. The electronic system of claim 17, wherein generating the first correction value based on the difference signal further comprises:

selecting one of the first adjusted signal and the second adjusted signal based on a polarity of the PRBS signal; and multiplying the selected one of the first adjusted signal and the second adjusted signal with a third data signal of the data signals.

20. The electronic system of claim 19, wherein selecting one of the first adjusted signal and the second adjusted signal based on the polarity of the PRBS signal comprises:

selecting the first adjusted signal based on the PRBS signal having the second polarity; and selecting the second adjusted signal based on the PRBS signal having the first polarity.

* * * * *